United States Patent
Dosaka (10) Patent No.: US 9,882,536 B2
(45) Date of Patent: Jan. 30, 2018

(54) WIRELESS APPARATUS AND METHOD FOR CONTROLLING VOLTAGE SUPPLIED TO AMPLIFIER UNIT

(71) Applicant: Hitachi Kokusai Electric Inc., Tokyo (JP)

(72) Inventor: Junya Dosaka, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 79 days.

(21) Appl. No.: 14/917,610

(22) PCT Filed: Sep. 5, 2014

(86) PCT No.: PCT/JP2014/073449
§ 371 (c)(1),
(2) Date: Mar. 9, 2016

(87) PCT Pub. No.: WO2015/041067
PCT Pub. Date: Mar. 26, 2015

(65) Prior Publication Data
US 2016/0226453 A1    Aug. 4, 2016

(30) Foreign Application Priority Data

Sep. 18, 2013   (JP) ................................ 2013-192967

(51) Int. Cl.
*H03F 1/32* (2006.01)
*H03F 3/21* (2006.01)
(Continued)

(52) U.S. Cl.
CPC ............. *H03F 1/32* (2013.01); *H03F 1/0222* (2013.01); *H03F 1/3247* (2013.01); *H03F 3/189* (2013.01);
(Continued)

(58) Field of Classification Search
CPC .................................. H03F 1/32; H03F 3/211
See application file for complete search history.

(56) References Cited

U.S. PATENT DOCUMENTS

| | | | |
|---|---|---|---|
| 6,725,021 B1 * | 4/2004 | Anderson ............. | H03F 1/0222 330/297 |
| 2006/0057980 A1 * | 3/2006 | Haque ................... | H03F 1/0238 455/127.1 |

(Continued)

FOREIGN PATENT DOCUMENTS

| JP | 2013-55449 A | 3/2013 |
|---|---|---|
| JP | 2013-74568 A | 4/2013 |
| WO | 2005/011109 A1 | 2/2005 |

OTHER PUBLICATIONS

International Search Report dated Dec. 9, 2014.

*Primary Examiner* — Patricia T Nguyen
(74) *Attorney, Agent, or Firm* — Bacon&Thomas, PLLC (57) ABSTRACT

Provided is a technique for effectively implementing DC removal during switching of transmission scheme or transmission data in a wireless apparatus equipped with a function for supplying a voltage to a power amplifier by ET control. When the ET control is not carried out in a power supply unit, more specifically, when an IQ signal is not present, a control unit outputs a pulse width modulation (PWM) signal for a fixed voltage via a switch unit. In other words, the switch unit selectively supplies a PWM signal for ET and a PWM signal for the fixed voltage to a switching amplifier. The switching amplifier is controlled by a predetermined control signal from the control unit.

14 Claims, 7 Drawing Sheets

(51) Int. Cl.
*H03F 1/02* (2006.01)
*H03F 3/189* (2006.01)
*H03F 3/24* (2006.01)
*H03F 3/217* (2006.01)

(52) U.S. Cl.
CPC ............ *H03F 3/211* (2013.01); *H03F 3/217* (2013.01); *H03F 3/245* (2013.01); *H03F 2200/102* (2013.01); *H03F 2200/129* (2013.01); *H03F 2200/336* (2013.01); *H03F 2200/351* (2013.01); *H03F 2200/78* (2013.01)

(56) References Cited

U.S. PATENT DOCUMENTS

| | | | |
|---|---|---|---|
| 2006/0245517 A1 | 11/2006 | Ikedo et al. | |
| 2007/0024372 A1* | 2/2007 | Hagen | H03F 1/0227 330/297 |
| 2012/0049953 A1* | 3/2012 | Khlat | H03F 1/0244 330/127 |
| 2014/0155127 A1* | 6/2014 | Dakshinamurthy | H04W 52/028 455/574 |
| 2014/0184335 A1* | 7/2014 | Nobbe | H03F 1/0227 330/291 |
| 2015/0333781 A1* | 11/2015 | Alon | H04B 1/0475 370/277 |
| 2016/0094186 A1* | 3/2016 | Cohen | H03F 1/0233 330/297 |

\* cited by examiner

WIRELESS APPARATUS AND METHOD FOR CONTROLLING VOLTAGE SUPPLIED TO AMPLIFIER UNIT

FIELD OF THE INVENTION

The present disclosure relates to a wireless apparatus and a method for controlling a voltage supplied to a power amplifier, and more particularly to a technique for controlling a voltage supplied to a power amplifier by envelope tracking (ET) control in an analog modulation scheme.

BACKGROUND OF THE INVENTION

As a digital modulation scheme of a wireless apparatus, quadrature modulation may be broadly classified into an analog scheme and a digital scheme. The analog scheme is advantageous in that relatively inexpensive implementation can be achieved; a distortion compensation technique of baseband feedback such as Cartesian is easily applicable; and direct conversion to a desired frequency can be achieved. On the other hand, it is disadvantageous in that it is necessary to adjust amplitude balance, orthogonality, and DC. The digital scheme is advantageous in that it is not necessary to adjust amplitude balance, orthogonality, and DC by using digital quadrature modulation. However, the cost is increased since a high-speed digital-to-analog converter (DAC) is required, and thus it is difficult to adopt direct conversion in the digital scheme.

Generally, the analog quadrature modulation is preferred in narrow-band wireless communications, since Cartesian technology by which an amplification can be achieved with high efficiency, low distortion and low cost may be used. Therefore, analog quadrature modulation may be employed in many cases. Further, recently, in view of realizing a high efficiency operation in the power amplifier for low power consumption and miniaturization of the wireless apparatus, there has been used a wireless technology using a power amplification device of an envelope tracking (ET) scheme.

As for the wireless transmission technology using the power amplification device of the ET scheme, various techniques have been proposed. For example, there is a technique to provide an ET power amplification device which not only reduces the non-linear distortion of a power amplifier but also has high power efficiency (see, e.g., Patent Document 1). Specifically, it is configured to detect an amplitude of an input signal, output a control signal based on amplitude-power supply voltage characteristics, and supply the power supply voltage according to the control signal to the power amplifier. Further, in the amplitude-power supply voltage characteristics, the power supply voltage varies linearly with respect to the amplitude and the lower limit is set to the power supply voltage.

Patent Document 1: Japanese Patent Application Publication No. 2013-55449

Figure 1:
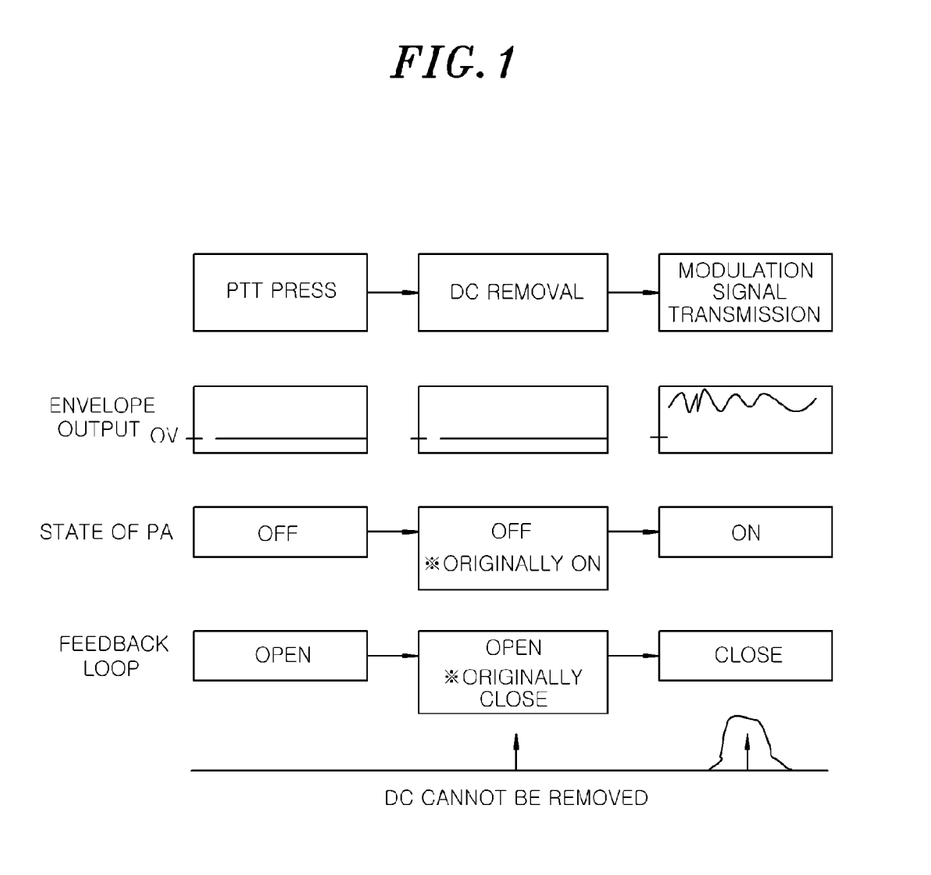
FIG. 1 shows a sequence from pressing of a PTT button to transmission of a modulation signal through a DC removal operation in a transceiver according to the related art.

Here, it is significant to remove the DC signal which is considered as one of the undesired waves included in the output signal of the wireless apparatus. In the wireless apparatus equipped with an analog quadrature modulation function, the DC removal is required to be completed before the transmission of the actual modulation signal. FIG. 1 shows a sequence when applied to a transceiver. When a PTT (Push To Talk) button is pressed, a DC removal process is performed and then the modulation signal is transmitted.

In the ET operation in general, an envelope is calculated from an IQ signal by a digital Signal processor (DSP) or the like, and a desire voltage is applied to a power amplifier while varying the applied voltage. The supply of the voltage to the power amplifier is performed by a switching amplifier such as class D amplifier.

In this regard, when, for example, a Cartesian loop is employed as a distortion compensation function, the DC removal needs to be performed with the configuration of the feedback loop since the Cartesian loop has a feedback-type configuration. In other words, it may be required that the wireless transmission unit is active, that is, the power amplifier is in an ON state. However, since the power amplifier is in an OFF state and further no IQ signal is present during DC calibration or the like, an envelope output is zero. Therefore, the feedback loop is in an OFF state at the timing of the DC removal, and a linearizer's operation is not performed. That is, there is a problem that appropriate DC removal cannot be performed.

The technique disclosed in Patent Document 1 can effectively solve non-linear distortion of the power amplifier. However, it is required to develop another technique since enough consideration is not made with respect to the above-described problem.

The present disclosure has been made in view of the above circumstances and has an object to solve the above-described problem.

SUMMARY OF THE INVENTION

In accordance with a first aspect of the present disclosure, there is provided a wireless apparatus having a function of supplying a voltage to a power amplifier by envelope tracking (ET) control, the wireless apparatus including: a control unit configured to control the voltage supplied to the power amplifier to be constant during switching of a transmission scheme or transmission data.

Further, the control unit may control the voltage supplied to the power amplifier to be constant by inputting a PWM signal for outputting a fixed voltage to a switching amplifier and supplying the fixed voltage from the switching amplifier to the power amplifier.

Further, the wireless apparatus may further includes a switch unit configured to switch the voltage supplied to the power amplifier to an output of a switching amplifier provided to supply the voltage to the power amplifier by the ET control or an output of a fixed voltage.

Further, in the wireless apparatus, a wireless unit may be include the power amplifier and an analog quadrature modulation unit, and the wireless unit may be commonly used in a plurality of communications schemes and Cartesian feedback may be formed in the wireless unit.

In accordance with a second aspect of the present disclosure, there is provided a method for controlling a voltage supplied to a power amplifier in a wireless apparatus having a function of supplying the voltage to the power amplifier by envelope tracking (ET) control, the method including: a control process of controlling the voltage supplied to the power amplifier to be constant and controlling the power amplifier to be in an ON state during switching of a transmission scheme or transmission data.

Further, in the control process, the voltage supplied to the power amplifier may be controlled to be constant by inputting a PWM signal for outputting a fixed voltage to a switching amplifier and supplying the fixed voltage from the switching amplifier to the power amplifier.

Further, in the control process, in case of a transmission scheme in which the voltage is supplied to the power amplifier by the ET control, the voltage supplied to the power amplifier may be supplied from a switching amplifier, which is operated by a PWM signal for outputting a fixed voltage, and in case of a transmission scheme in which the fixed voltage is directly supplied to the power amplifier, the voltage supplied to the power amplifier is directly supplied from a DC power source without passing through the switching amplifier.

Further, a wireless unit, including the power amplifier and an analog quadrature modulation unit and being equipped with wireless schemes including a first communication scheme which is a transmission scheme using the ET control and a second communication scheme which is a transmission scheme without using the ET control, may be configured to be commonly used in the first communication scheme and the second communication scheme, and Cartesian feedback may be formed in the wireless unit.

Effect of the Present Invention

According to the present disclosure, DC removal during the switching of a transmission scheme or transmission data is effectively implemented in the wireless apparatus equipped with the function for supplying the voltage to the power amplifier by the ET control.

DETAILED DESCRIPTION OF THE EMBODIMENTS

Hereinafter, embodiments of the present disclosure (hereinafter, simply referred to as "embodiments") will be described in detail with reference to the accompanying drawings. In the following embodiments, a dual-type transceiver (wireless apparatus) is assumed to have two analog quadrature modulation functions of a time division multiple access (TDMA) scheme and a single channel per carrier (SCPC) scheme, which is one type of a frequency division multiple access (FDMA) scheme. In the SCPC scheme of a continuous transmission type, a power amplifier (power amplification unit) is controlled by using envelope tracking (ET). On the other hand, in the TDMA scheme of a ¼-slot transmission type, the ET control is not carried out. The following description will focus mainly on a voltage supply to the power amplifier of the wireless apparatus.

First Embodiment

Figure 2:
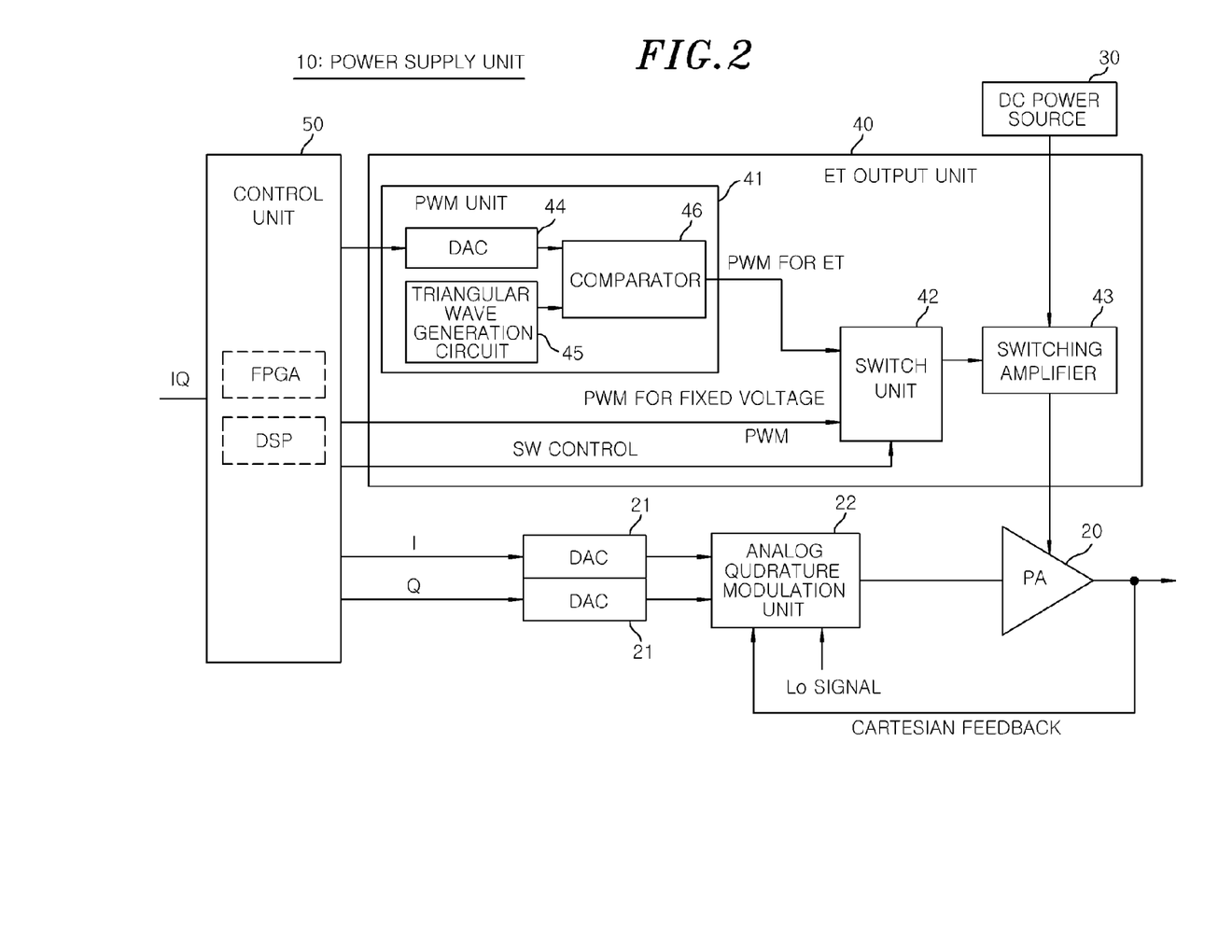
FIG. 2 shows a configuration of a wireless unit and a power supply unit for supplying a voltage to a power amplifier in a wireless apparatus according to a first embodiment.

FIG. 2 is a block diagram showing a schematic configuration of a power supply unit 10 according to a first embodiment.

The power supply unit 10 includes a DC power source 30, an ET output unit 40, and a control unit 50. The power supply unit 10 supplies a power to a power amplifier 20 included in a wireless unit. The wireless unit is configured to include the control unit 50, digital-to-analog converters (DACs) 21, an analog quadrature modulation unit 22 and the power amplifier 20. The control unit 50 functions as a part of the power supply unit 10 as well as a part of the wireless unit.

The control unit 50 is configured to include a digital signal processor (DSP) and/or a field programmable gate array (FPGA), and acquires an IQ signal. The control unit 50 outputs an I signal and a Q signal to the respective DACs 21 when functioning as the wireless unit. In both of the SCPC scheme and the TDMA scheme, the control unit 50 can be used commonly. Further, the DSP and the FPGA included in the control unit 50 may be individually provided in each of the schemes or may be provided in common.

Further, when functioning as a part of the power supply unit 10, the control unit 50 controls the ET output unit 40 to control the voltage supplied to the power amplifier 20. Although the detailed operation and the like will be described later, the control unit 50, as a so-called power calculation, calculates an envelope from the IQ signal and outputs the calculation result to the ET output unit 40.

The DACs 21 perform digital-to-analog conversion of the I signal and the Q signal and output the converted signals to the analog quadrature modulation unit 22. The converted signals are modulated by the analog quadrature modulation unit 22 and the modulated signal is amplified by the power amplifier 20 to be transmitted from an antenna. Further, an output of the power amplifier 20 is fed back to the analog quadrature modulation unit 22, thereby forming a Cartesian feedback. Further, by varying a Lo signal of the analog quadrature modulation unit 22, it may be configured to respond to various frequencies.

The ET output unit 40 includes a pulse width modulation (PWM) unit 41, a switch unit 42 and a switching amplifier (e.g., a class D amplifier) 43. The PWM unit 41 includes a digital-to-analog converter (DAC) 44, a triangular wave generation circuit 45, and a comparator 46. The DAC 44 converts the calculation result of the envelope obtained from the control unit 50 into an analog signal and outputs the analog signal to the comparator 46. The comparator 46 outputs a PWM signal for ET to the switching amplifier 43 through the switch unit 42 based on the envelope of the analog signal outputted from the DAC 44 and the triangular wave outputted from the triangular wave generation circuit 45.

When the operation by the ET control is not performed, more specifically, when no IQ signal is present, the control unit 50 outputs a PWM signal for a fixed voltage via the switch unit 42. That is to say, by means of the switch unit 42, the PWM signal for the operation by the ET control (hereinafter, referred to as "ET operation") and the PWM signal for the fixed voltage are selectively supplied to the switching amplifier 43. The switching amplifier 43 is controlled in response to a predetermined control signal from the control unit 50.

The state where no IQ signal is present occurs during the switching of the transmission scheme or the transmission data. "During the switching of the transmission data" is, e.g., a period of LP+G (a linearizer preamble and a guard time for burst transient response) set at the head of one radio frame (40 msec) of the SCPC scheme. The period of LP+G (the linearizer preamble and the guard time for burst transient response) is provided to improve the linearity of a transmission power amplifier in a mobile station and a base station, and the content thereof is not specified. DC calibration or phase training is performed during this period.

Figure 3:
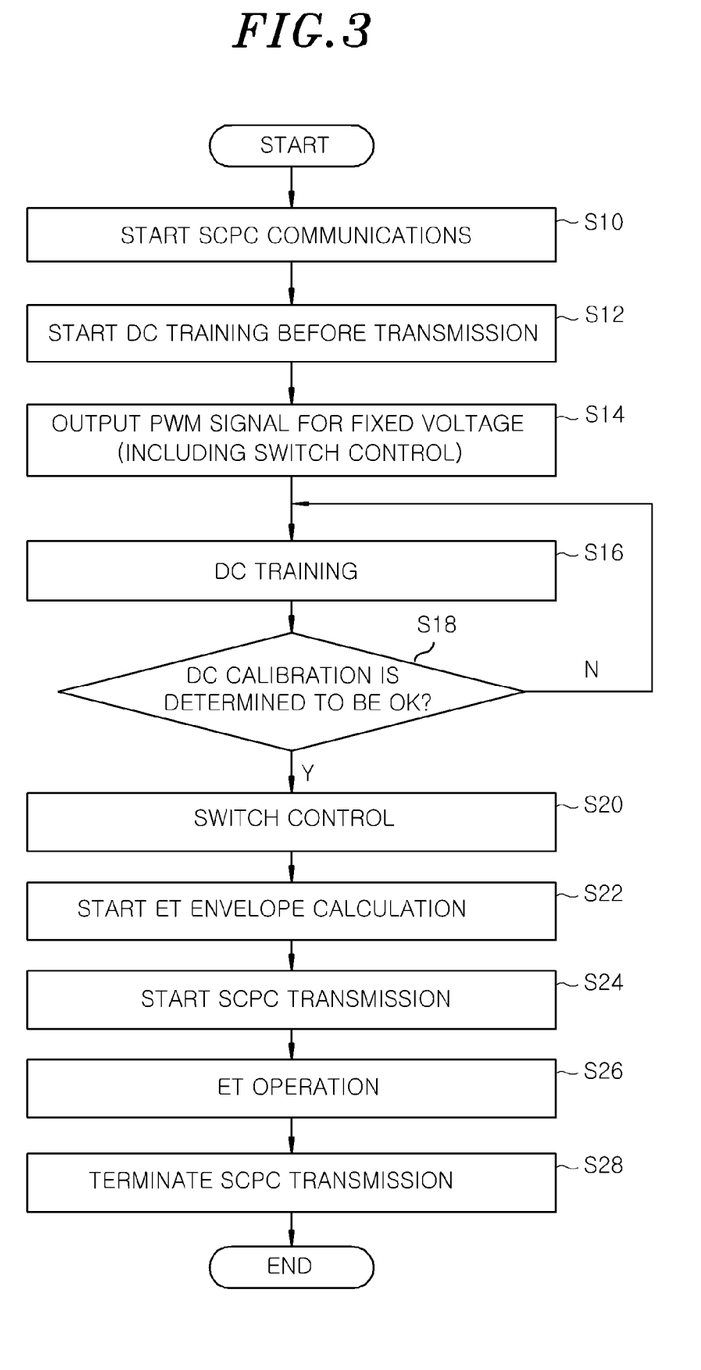
FIG. 3 is a flowchart showing an operation of the voltage supply to the power amplifier according to the first embodiment.

The operation performed by the above-described configuration will be described with reference to a flowchart shown in FIG. 3. When a user presses a PTT button of the transceiver to initiate the communication of the SCPC scheme (S10), DC training before transmission is started (S12).

When the DC training before transmission is started (S12), the control unit 50 outputs the PWM signal for a fixed voltage and controls the switch unit 42 to which the PWM signal is outputted such that a path of the PWM signal for the fixed voltage is connected to the switching amplifier 43 (S14). Thereafter, the actual DC training is performed (S16). The DC training is continued (S16) until DC calibration is determined to be appropriate ('NO' in S18). That is, during this training period, the power amplifier 20 is controlled to be in an ON state by supplying a constant voltage thereto.

When the DC calibration is determined to be appropriate ('YES' in S18), the controller 50 switches the switch unit 42 to connect the PWM unit 41 with the switching amplifier 43 (S20). At the same time, the control unit 50 starts the calculation of the envelope for the ET control and outputs the calculation result to the ET output unit 40 (S22). Further, the control unit 50 starts the SCPC transmission and outputs the I and Q signals to the DACs 21 (S24). As a result, during the SCPC transmission, the power amplifier 20 amplifies the transmission signal obtained from the analog quadrature modulation unit 22 under the ET operation and outputs the amplified signal to the antenna (S26). When the user stops pressing the PTT button, the SCPC transmission is terminated (S28).

The DC calibration or the phase training performed during the period of LP+G is not limited to be performed at the timing when the transmission scheme is switched to the SCPC scheme, and it may be also performed during the communication of the wireless apparatus due to temperature influence or the like. However, in this case, the control unit 50 is controlled to output a sine wave from the DAC 44 by outputting a signal of all zeros during the period of LP+G. In other words, the envelope is constant.

As described above, according to the first embodiment, when a feedback loop (Cartesian feedback) is formed in the analog quadrature modulation scheme, it is possible to stably implement DC removal, thereby achieving both of high efficiency amplification and distortion compensation. In other words, it is possible to implement the stable DC removal and the distortion compensation by the Cartesian feedback while adopting the high efficiency amplification by the ET control. This makes it possible to suppress the amount of heat generated by the power amplifier 20 by the high efficiency amplification so as to make a size of heat dissipation mechanism small. Therefore, a space-saving design and a low-cost design can be realized in the configuration of the wireless apparatus. In particular, when the wireless apparatus is equipped with both of the SCPC scheme which requires the ET operation and the TDMA scheme which does not require the ET operation and uses component such as the control unit 50 in common, DC removal can be implemented appropriately by using the common component without using expensive high performance parts.

In recent years, when a disaster and the like occurs and mutual aid is performed through broadband connection, a dual-type wireless apparatus is required as a official wireless apparatus. For example, in the fire department, different types of wireless communications schemes may be used in each fire service areas. Further, different types of wireless communications schemes may be used between different departments, e.g., between the fire department and the police department. In such cases, conventionally, it is necessary to provide a plurality of wireless apparatuses, which causes inconvenience at a disaster recovery site. However, by using the dual-type wireless apparatus according to the present embodiment, it is possible to perform appropriate communications between multiple departments with one wireless apparatus.

Further, in the configuration of the wireless apparatus, since it is possible to respond to various frequencies by varying the Lo signal of the analog quadrature modulation unit 22, it is applicable to hardware architecture of a multi-band wireless unit in software defined radio. Further, it is also applicable to hardware architecture of a white space wireless unit (secondary use) to which attention has been paid in recent years.

Second Embodiment

Figure 4:
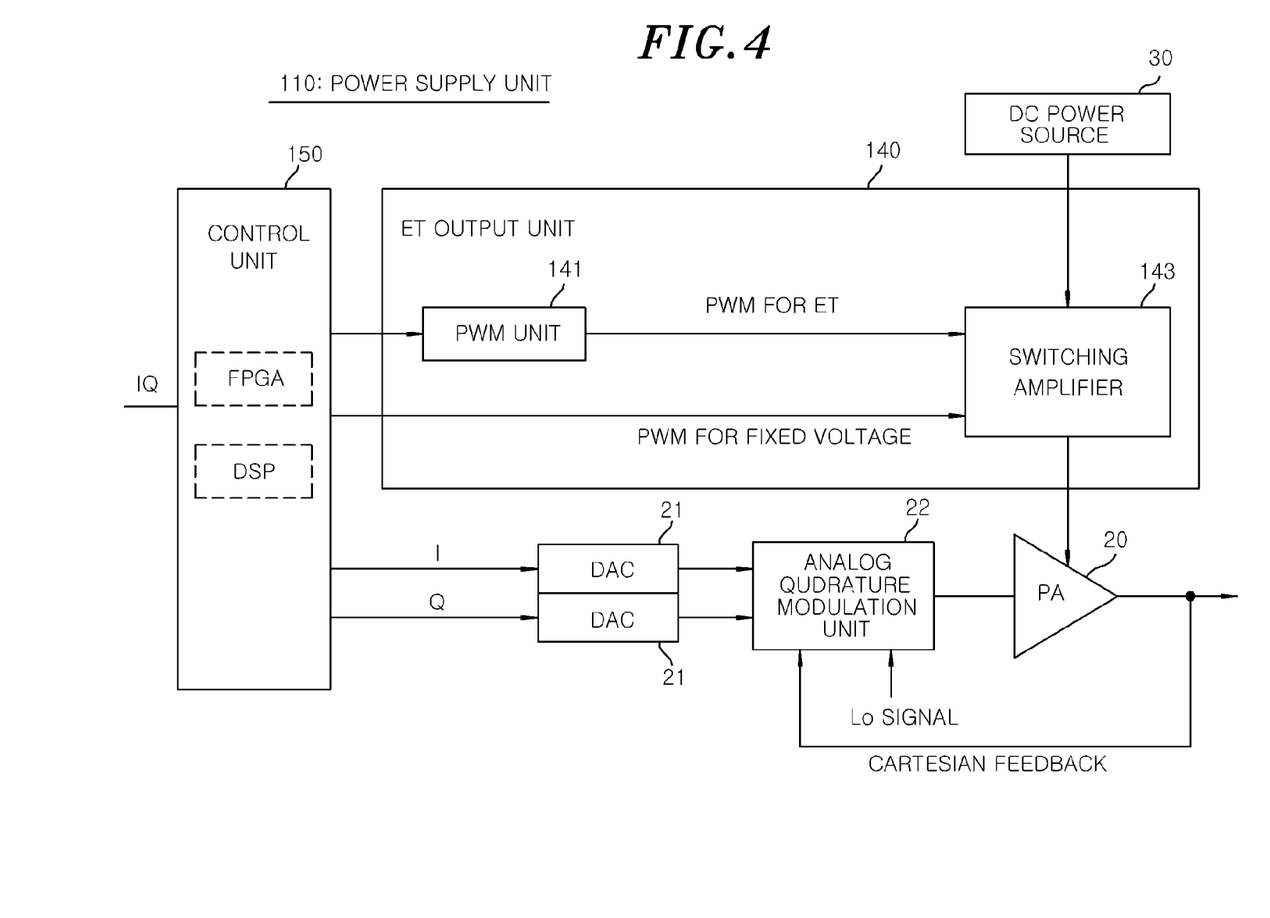
FIG. 4 shows a configuration of a wireless unit and a power supply unit for a power amplifier in a wireless apparatus according to a second embodiment.

FIG. 4 shows a configuration of a power supply unit 110 according to a second embodiment. The second embodiment is a modification of the first embodiment. Hereinafter, the configuration, which is different from that of the first embodiment, will be mainly described in detail. In the configuration of the power supply unit 110, the switch unit 42 of the power supply unit 10 according to the first embodiment is omitted. In other words, an ET output unit 140 is configured to include a PWM unit 141 and a switching amplifier 143. Further, a configuration of the PWM unit 141 is identical to that of the PWM unit 41 of the first embodiment.

The control unit 150 switchably outputs an analog envelope signal and a PWM signal for a fixed voltage to the ET output unit 140. In other words, in case of keeping an output of the ET output unit 140 constant without performing the ET control during the switching of the transmission scheme or the transmission data, the control unit 150 directly outputs the PWM signal for the fixed voltage to the switching amplifier 143 without outputting a signal to the PWM unit 141. On the other hand, when the ET control is performed, the control unit 150 outputs the envelope signal to the PWM unit 141 without directly outputting the PWM signal for the fixed voltage to the switching amplifier 143.

According to the second embodiment, the same advantageous effects as with the first embodiment can be obtained. Further, since the switch unit 42 is omitted in the second embodiment, the configuration thereof can be simplified.

Third Embodiment

Figure 5:
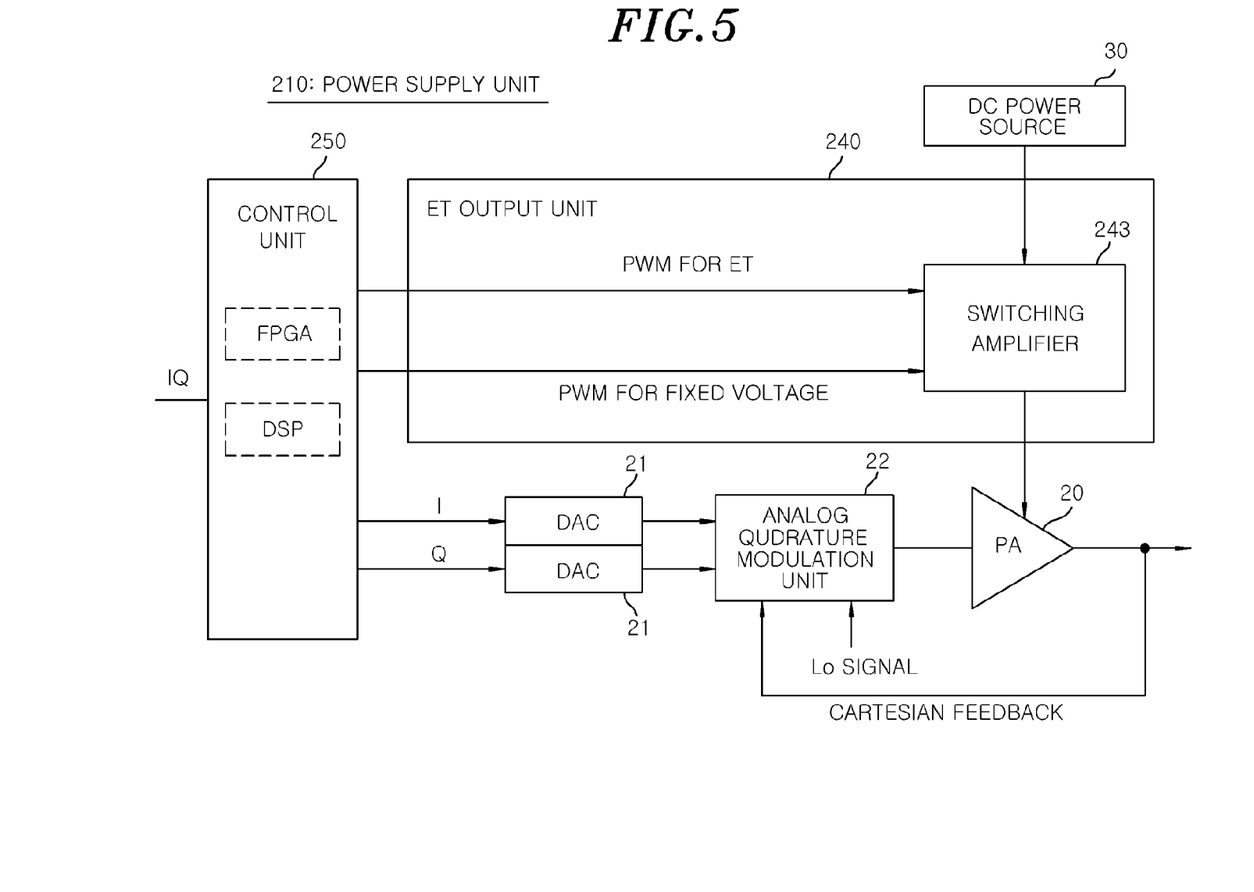
FIG. 5 shows a configuration of a wireless unit and a power supply unit for a power amplifier in a wireless apparatus according to a third embodiment.

FIG. 5 shows a configuration of a power supply unit 210 according to a third embodiment. The third embodiment is a modification of the second embodiment. Hereinafter, the configuration, which is different from that of the second embodiment, will be mainly described in detail. In the configuration of the power supply unit 210, the PWM unit 141 of the power supply unit 110 according to the second embodiment is omitted. That is, an ET output unit 240 is configured to include a switching amplifier 243. In other words, a control unit 250 has the functions of the PWM units 41 and 141 of the first and the second embodiment so that the PWM signal is directly outputted to the switching amplifier 243 from the control unit 250. Therefore, in case of keeping an output of the ET output unit 240 constant without performing the ET control during the switching of the transmission scheme or the transmission data, the control unit 250 outputs the PWM signal for the fixed voltage to the switching amplifier 243. On the other hand, when the ET control is performed, the control unit 250, after calculating the envelope signal based on the IQ signal, performs the above-described process of generating the PWM signal in each of the PWM units 41 and 141 through, e.g., the calculation using the DSP based on the envelope signal to thereby obtain a PWM signal for ET. The control unit 250 outputs the PWM signal for ET to the switching amplifier 243.

According to the third embodiment, the same advantageous effects as with the second embodiment can be obtained. Further, since the PWM unit 41 is omitted in the third embodiment, the configuration thereof can be simplified.

Fourth Embodiment

Figure 6:
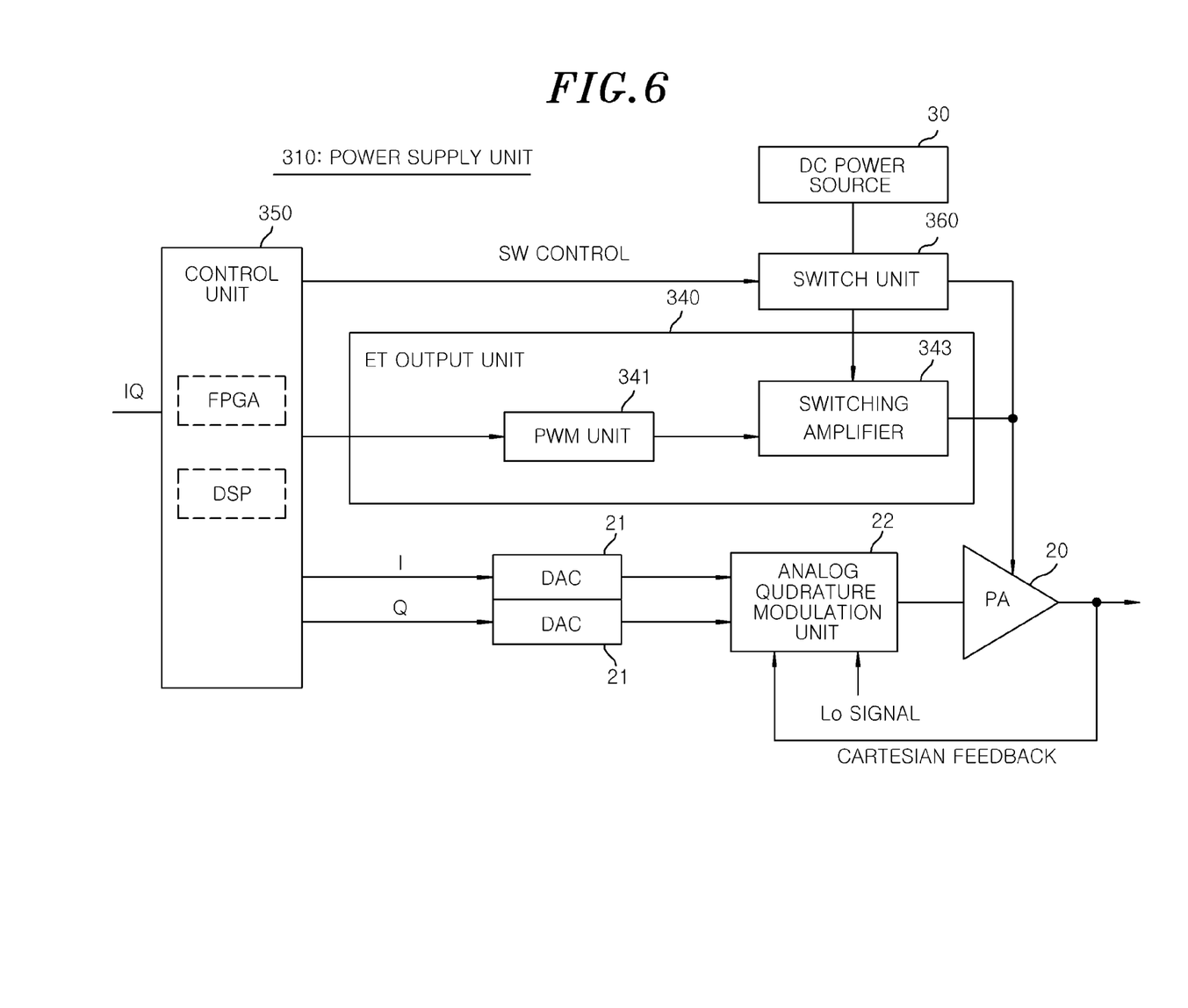
FIG. 6 shows a configuration of a wireless unit and a power supply unit for a power amplifier in a wireless apparatus according to a fourth embodiment.

FIG. 6 shows a configuration of a power supply unit 310 according to a fourth embodiment. The fourth embodiment is a modification of the first embodiment. In the fourth embodiment, when the ET operation is performed, a control unit 350 controls an ET output unit 340 to supply a voltage from a switching amplifier 343 to the power amplifier 20. On the other hand, when the ET operation is not performed, the control unit 350 controls a DC power source 30 such that a voltage from the DC power source 30 is supplied directly to the power amplifier 20. Therefore, a switch unit 360 is arranged between the DC power source 30 and the ET output unit 340, and the control unit 350 controls the operation of the switch unit 360.

The power amplifier 20, the DACs 21, and the analog quadrature modulation unit 22 serving as the wireless unit are configured to be used in both types of the SCPC scheme and the TDMA scheme. In this case, for example, if it is configured such that both of the SCPC scheme and the TDMA scheme share the function of the PWM unit 41 as in the first embodiment, it becomes necessary to use parts or components for the wideband TDMA scheme. That is, high speed parts or components are required, which leads to an increase in cost.

Therefore, in the fourth embodiment, a voltage supply path when the operation is performed in the wideband TDMA scheme and a voltage supply path when the operation is performed in the SCPC scheme are separately provided.

Figure 7:
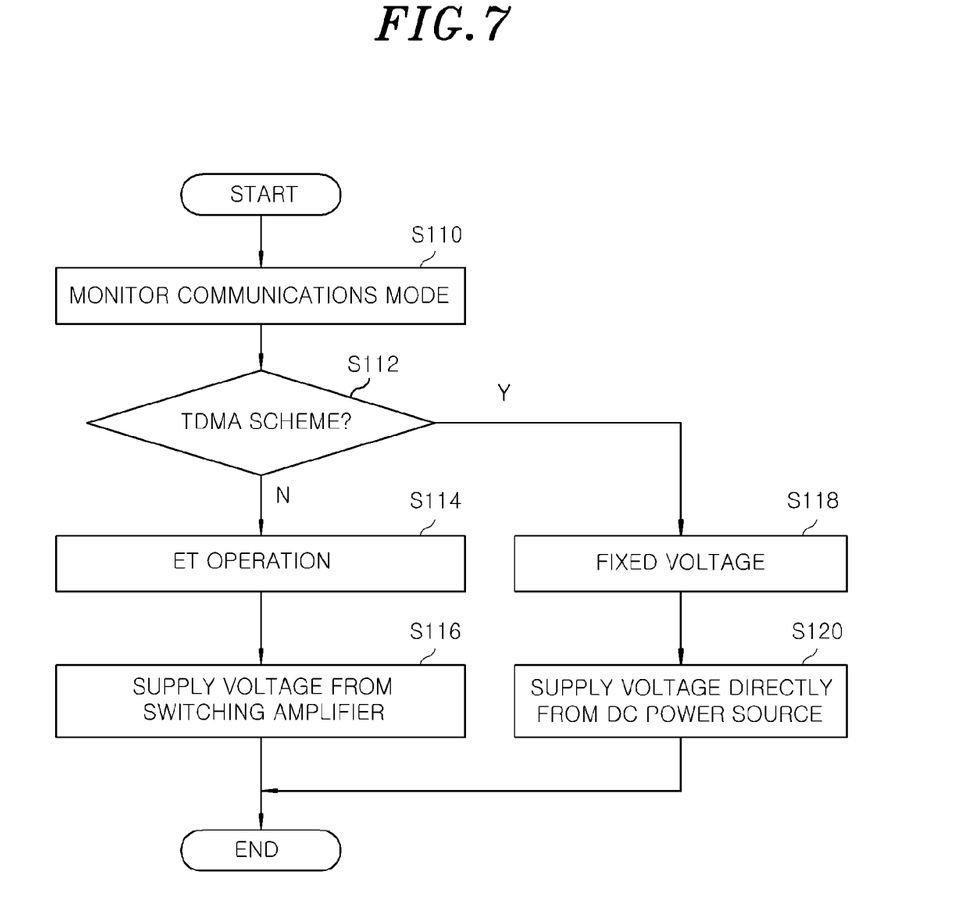
FIG. 7 is a flowchart showing an operation of the voltage supply to the power amplifier according to the fourth embodiment.

FIG. 7 is a flow chart showing the operation of the power supply unit 310. The control unit 350 monitors whether the communications mode is the SCPC scheme or the TDMA scheme (S110).

When it is determined that the communications mode is the SCPC scheme ('NO' in S112), the control unit 350 controls the switch unit 360 to connect the DC power source 30 with the switching amplifier 343 and operates the ET output unit 340 (S114). In this case, a voltage is applied from the switching amplifier 43 to the power amplifier 20 (S116). When it is determined that the communications mode is the TDMA scheme, the control unit 350 determines to supply a fixed voltage without performing the ET operation (S118). In this case, the control unit 350 controls the switch unit 360 to connect the DC power source 30 with the power amplifier 20, thereby applying a constant voltage directly from the DC power source 30 to the power amplifier 20 (S120).

According to the fourth embodiment, the voltage of the signal transmitted through the switch unit 360 of the fourth embodiment is higher as compared to the voltage of the signal transmitted through the switch unit 42 of the first embodiment. Thus, it may be somewhat disadvantageous in terms of efficiency, but the cost can be reduced.

Further, when the operation is performed in the SCPC scheme, a constant voltage may be applied to the power amplifier 20 by operating the ET output unit 340 at the time of the DC calibration, as in the first embodiment. Even in this case, since the ET output unit 340 is operated when the operation is performed in the narrow-band SCPC scheme, the specifications of the parts themselves may be set at a level required to operate the SCPC scheme. Further, a voltage from the DC power source 30 may be directly applied to the power amplifier 20 at the time of the DC calibration.

While the exemplary embodiments have been described above to explain the present disclosure, it is understood by those skilled in that art that various modifications and rearrangements of the parts may be resorted to without departing from the scope of the present disclosure.

In the exemplary embodiments of the present disclosure, as for the switching timing of the transmission scheme or transmission data during which it is determined that whether to perform the ET control, the switching timing of the radio communications scheme or the DC calibration timing occurred at the starting timing of the communications or during the communications has been described as an example. However, the present disclosure is not limited to the timings of these embodiments and can be applied to any case where an ON/OFF of the ET control is switched in response to various communications conditions and other conditions.

INDUSTRIAL APPLICABILITY

The present disclosure relates to a wireless apparatus and a method for controlling a voltage supplied to a power amplifier. More particularly, the present disclosure is broadly applicable to the wireless apparatus which controls the voltage supplied to the power amplifier by envelope tracking (ET) in an analog modulation scheme.

What is claimed is:

1. A wireless apparatus having a function of supplying a voltage to a power amplifier by envelope tracking (ET) control, comprising:
   a control unit configured to control the voltage supplied to the power amplifier to be constant when DC training is started in a predetermined period of time set in a radio frame and perform the ET control when DC calibration is completed by the DC training.

2. The wireless apparatus of claim 1, wherein the control unit controls the voltage supplied to the power amplifier to be constant by inputting a PWM signal for outputting a fixed voltage to a switching amplifier and supplying the fixed voltage from the switching amplifier to the power amplifier.

3. The wireless apparatus of claim 1, further comprising a switch unit configured to switch, as the voltage supplied to the power amplifier, an output of a switching amplifier provided to supply the voltage to the power amplifier by the ET control and an output of a fixed voltage.

4. The wireless apparatus of claim 1, further comprising a wireless unit configured to include the power amplifier and an analog quadrature modulation unit, wherein the wireless unit is commonly used in a plurality of communications schemes and Cartesian feedback is formed in the wireless unit.

5. A method for controlling a voltage supplied to a power amplifier in a wireless apparatus having a function of supplying the voltage to the power amplifier by envelope tracking (ET) control, comprising:
   a control process of controlling the voltage supplied to the power amplifier to be constant and controlling the power amplifier to be in an ON state when DC training is started in a predetermined time period set in a radio frame, and performing the ET control when DC calibration is completed by the DC training.

6. The method of claim 5, wherein, in the control process, the voltage supplied to the power amplifier is controlled to be constant by inputting a PWM signal for outputting a fixed voltage to a switching amplifier and supplying the fixed voltage from the switching amplifier to the power amplifier.

7. The method of claim 5, wherein, in the control process, in case of a transmission scheme in which the voltage is supplied to the power amplifier by the ET control, the voltage supplied to the power amplifier is supplied from a switching amplifier, which is operated by a PWM signal for outputting a fixed voltage, and in case of a transmission scheme in which the fixed voltage is supplied to the power amplifier, the voltage supplied to the power amplifier is directly from a DC power source without passing through the switching amplifier.

8. The method of claim 5, wherein a wireless unit, including the power amplifier and an analog quadrature modulation unit and being equipped with wireless schemes including a first communication scheme which is a transmission scheme using the ET control and a second communication scheme which is a transmission scheme without using the ET control, is configured to be commonly used in the first communication scheme and the second communication scheme, and
   wherein Cartesian feedback is formed in the wireless unit.

9. The wireless apparatus of claim 2, further comprising a wireless unit configured to include the power amplifier and an analog quadrature modulation unit, wherein the wireless unit is commonly used in a plurality of communications schemes and Cartesian feedback is formed in the wireless unit.

10. The wireless apparatus of claim 3, further comprising a wireless unit configured to include the power amplifier and an analog quadrature modulation unit, wherein the wireless unit is commonly used in a plurality of communications schemes and Cartesian feedback is formed in the wireless unit.

11. The method of claim 6, wherein a wireless unit, including the power amplifier and an analog quadrature modulation unit and being equipped with wireless schemes including a first communication scheme which is a transmission scheme using the ET control and a second communication scheme which is a transmission scheme without using the ET control, is configured to be commonly used in the first communication scheme and the second communication scheme, and
   wherein Cartesian feedback is formed in the wireless unit.

12. The method of claim 7, wherein a wireless unit, including the power amplifier and an analog quadrature modulation unit and being equipped with wireless schemes including a first communication scheme which is a transmission scheme using the ET control and a second communication scheme which is a transmission scheme without using the ET control, is configured to be commonly used in the first communication scheme and the second communication scheme, and
   wherein Cartesian feedback is formed in the wireless unit.

13. The wireless apparatus of claim 1, wherein the predetermined time period is set when communication of single channel per carrier (SCPC) scheme is initiated by pressing a push to talk (PTT) button by a user.

14. The method of claim 5, wherein the predetermined time period is set when communication of single channel per carrier (SCPC) scheme is initiated by pressing a push to talk (PTT) button by a user.

* * * * *